(12) United States Patent
Lee et al.

(10) Patent No.: US 11,710,813 B2
(45) Date of Patent: Jul. 25, 2023

(54) LIGHT EMITTING DIODE MODULE

(71) Applicant: SAMSUNG ELECTRONICS CO., LTD., Suwon-si (KR)

(72) Inventors: Changjoon Lee, Suwon-si (KR); Seongho Son, Suwon-si (KR); Jongsung Lee, Suwon-si (KR); Youngki Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 289 days.

(21) Appl. No.: 16/863,069

(22) Filed: Apr. 30, 2020

(65) Prior Publication Data
US 2020/0350476 A1   Nov. 5, 2020

(30) Foreign Application Priority Data

May 3, 2019   (KR) .................. 10-2019-0052516
Aug. 9, 2019   (KR) .................. 10-2019-0097215
Apr. 17, 2020   (KR) .................. 10-2020-0046933

(51) Int. Cl.
*H01L 33/62*   (2010.01)
*G02B 1/14*   (2015.01)
*H01L 25/075*   (2006.01)
*G09F 9/302*   (2006.01)
*G09G 3/32*   (2016.01)

(52) U.S. Cl.
CPC ............. *H01L 33/62* (2013.01); *G02B 1/14* (2015.01); *G09F 9/3026* (2013.01); *G09G 3/32* (2013.01); *H01L 25/0753* (2013.01); *G09G 2310/0267* (2013.01); *G09G 2310/0275* (2013.01)

(58) Field of Classification Search
None
See application file for complete search history.

(56) References Cited

U.S. PATENT DOCUMENTS 4,041,300 A * 8/1977 Blount ............... G03B 15/0442
                                                                    362/13
5,586,011 A * 12/1996 Alexander ........... H05K 1/0218
                                                                    174/355

(Continued)

FOREIGN PATENT DOCUMENTS

KR   10-2017-0005341 A   1/2017
KR   10-2019-0041413 A   4/2019
WO       2019/045549 A1   3/2019

OTHER PUBLICATIONS

International Search Report (PCT/ISA/210) dated Sep. 1, 2020 issued by the International Searching Authority in International Application No. PCT/KR2020/005798.

(Continued)

*Primary Examiner* — Patrick N Edouard
*Assistant Examiner* — Peijie Shen
(74) *Attorney, Agent, or Firm* — Sughrue Mion, PLLC

(57) ABSTRACT

A light emitting diode (LED) module includes an integrated substrate, the integrated substrate including a plurality of LEDs; a glass substrate; and a signal wiring layer provided on the glass substrate. The signal wiring layer includes a plurality of signal electrodes configured to supply a data signal to the plurality of LEDs. The LED module further includes a conductive pattern provided on at least one surface of the integrated substrate, and connected to a ground.

13 Claims, 18 Drawing Sheets

(56) References Cited

U.S. PATENT DOCUMENTS

| | | | | |
|---|---|---|---|---|
| 6,288,344 | B1* | 9/2001 | Youker | H05K 9/0039 |
| | | | | 174/250 |
| 6,441,625 | B1* | 8/2002 | McAllister | G01N 27/4473 |
| | | | | 324/226 |
| 9,349,996 | B2* | 5/2016 | Yang | H01L 27/1255 |
| 2004/0188685 | A1* | 9/2004 | Lin | H01L 29/66765 |
| | | | | 257/E21.414 |
| 2005/0174050 | A1* | 8/2005 | Han | H05B 33/22 |
| | | | | 313/506 |
| 2005/0184313 | A1* | 8/2005 | Han | H05K 1/0259 |
| | | | | 257/200 |
| 2007/0001927 | A1* | 1/2007 | Ricks | G09F 9/3026 |
| | | | | 345/1.1 |
| 2008/0024714 | A1* | 1/2008 | Park | H01L 23/552 |
| | | | | 349/150 |
| 2008/0053714 | A1* | 3/2008 | Ito | G06F 3/0443 |
| | | | | 29/832 |
| 2009/0033856 | A1 | 2/2009 | Kiryuschev et al. | |
| 2009/0103230 | A1* | 4/2009 | Ryu | H03K 17/962 |
| | | | | 361/220 |
| 2009/0117729 | A1* | 5/2009 | Huang | H01L 23/60 |
| | | | | 257/E23.069 |
| 2009/0180048 | A1* | 7/2009 | Kim | H05K 7/20963 |
| | | | | 264/239 |
| 2009/0190277 | A1* | 7/2009 | Hiew | G06F 1/1632 |
| | | | | 361/56 |
| 2009/0251841 | A1* | 10/2009 | Whalin | H01R 13/6658 |
| | | | | 361/126 |
| 2010/0044851 | A1* | 2/2010 | Choi | H01L 23/60 |
| | | | | 257/E21.511 |
| 2010/0081302 | A1* | 4/2010 | Atkinson | H01R 13/6474 |
| | | | | 439/98 |
| 2010/0247810 | A1* | 9/2010 | Yukinobu | H01B 1/20 |
| | | | | 428/688 |
| 2012/0062485 | A1* | 3/2012 | Kim | G06F 3/0412 |
| | | | | 345/173 |
| 2013/0077035 | A1* | 3/2013 | Kanzaki | G02F 1/1337 |
| | | | | 438/30 |
| 2013/0248890 | A1* | 9/2013 | Yoo | H10K 71/00 |
| | | | | 257/40 |
| 2014/0062637 | A1* | 3/2014 | Yoo | H01F 17/0013 |
| | | | | 336/105 |
| 2015/0029636 | A1* | 1/2015 | Lin | H01R 13/6485 |
| | | | | 361/220 |
| 2015/0070622 | A1* | 3/2015 | Christophy | G06F 1/1656 |
| | | | | 361/220 |
| 2015/0206470 | A1* | 7/2015 | Wu | G02F 1/136286 |
| | | | | 345/103 |
| 2016/0029479 | A1* | 1/2016 | Yoo | H05K 1/0259 |
| | | | | 361/56 |
| 2016/0057899 | A1* | 2/2016 | Chien | H04M 1/0266 |
| | | | | 455/575.8 |
| 2016/0064120 | A1* | 3/2016 | Wakabayashi | H01B 7/0045 |
| | | | | 174/72 A |
| 2016/0104427 | A1* | 4/2016 | Matsueda | G09G 3/3233 |
| | | | | 345/212 |
| 2016/0179229 | A1* | 6/2016 | Ahn | G06F 3/0447 |
| | | | | 345/173 |
| 2016/0181345 | A1* | 6/2016 | Lee | H05K 1/028 |
| | | | | 257/40 |
| 2016/0291430 | A1* | 10/2016 | Sun | H01L 27/1255 |
| 2017/0148374 | A1* | 5/2017 | Lee | G09G 5/14 |
| 2017/0278830 | A1* | 9/2017 | Kim | H01L 25/50 |
| 2017/0288392 | A1* | 10/2017 | Proie | H02H 9/02 |
| 2018/0150274 | A1* | 5/2018 | Shin | G06F 3/147 |
| 2018/0188579 | A1* | 7/2018 | Jeong | G02F 1/133345 |
| 2018/0190631 | A1 | 7/2018 | Kim et al. | |
| 2018/0254226 | A1* | 9/2018 | Iguchi | H01L 27/156 |
| 2019/0027534 | A1 | 1/2019 | Rotzoll et al. | |
| 2019/0115329 | A1 | 4/2019 | Min et al. | |
| 2019/0139501 | A1* | 5/2019 | Lin | G09G 3/3607 |
| 2019/0205077 | A1* | 7/2019 | Paolini, Jr. | G09G 3/348 |
| 2019/0213375 | A1* | 7/2019 | Suwald | H01L 27/0248 |
| 2019/0229169 | A1* | 7/2019 | Huang | H01L 27/1251 |
| 2019/0265830 | A1* | 8/2019 | Chen | G06F 3/0448 |
| 2019/0325812 | A1* | 10/2019 | Mao | G06F 3/1446 |
| 2019/0346987 | A1* | 11/2019 | Shi | G06F 3/0416 |
| 2020/0272001 | A1* | 8/2020 | Kameda | G02F 1/13338 |
| 2020/0387201 | A1* | 12/2020 | Nakagawa | G06F 1/181 |
| 2020/0388636 | A1* | 12/2020 | Yueh | H01L 27/124 |
| 2021/0082884 | A1* | 3/2021 | Schwarz | H01L 25/0753 |
| 2021/0202907 | A1* | 7/2021 | Lee | H10K 59/10 |
| 2021/0217353 | A1* | 7/2021 | Zhao | H01L 25/167 |
| 2021/0364870 | A1* | 11/2021 | Chen | H05K 1/0259 |
| 2022/0171497 | A1* | 6/2022 | Wu | G06F 3/0443 |
| 2022/0214232 | A1* | 7/2022 | Ishizaki | G01L 1/142 |

OTHER PUBLICATIONS

Communication dated Mar. 4, 2022 by the European Patent Office in European Application No. 20802573.4.

* cited by examiner

LIGHT EMITTING DIODE MODULE

CROSS-REFERENCE TO RELATED APPLICATION(S)

This application is based on and claims priority under 35 U.S.C. § 119 to Korean Patent Application No. 10-2019-0052516, filed on May 3, 2019, Korean Patent Application No. 10-2019-0097215, filed on Aug. 9, 2019, and Korean Patent Application No. 10-2020-0046933, filed on Apr. 17, 2020, in the Korean Intellectual Property Office, the disclosures of which are incorporated by reference herein in their entirety.

BACKGROUND

1. Field

The disclosure relates to a light emitting diode module configured to display an image using a light emitting diode.

2. Description of Related Art

A display apparatus may include a non-self-emissive display panel such as a liquid crystal display (LCD), and a self-emissive display panel that generates light corresponding to a data signal.

Particularly, as for the self-emissive display panel, a light emitting diode (LED) corresponding to an inorganic light emitting diode has been actively studied. An LED is a device for converting an electrical signal into the form of light such as infrared rays or visible light, by using the characteristics of compound semiconductors. The LED may be used for home appliances, remote controls, digital signage, and a variety of automation devices. In addition, the LED has been widely used for small hand-held electronic devices and large-size display apparatuses. Further, with the recent development of micro LED displays manufactured by miniaturizing an LED, the LED has been implemented in the form of modular displays.

SUMMARY

Proved is a light emitting diode (LED) module capable of preventing damage to an LED, which may be caused by electrostatic discharge, by implementing a conductive pattern in the LED module.

Additional aspects will be set forth in part in the description which follows and, in part, will be apparent from the description, or may be learned by practice of the presented embodiments.

In accordance with an aspect of the disclosure, there is provided a light emitting diode (LED) module, including: an integrated substrate including a plurality of LEDs; a glass substrate; and a signal wiring layer provided on the glass substrate, the signal wiring layer including a plurality of signal electrodes configured to supply a data signal to the plurality of LEDs; and a conductive pattern provided on at least one surface of the integrated substrate, and connected to a ground.

The integrated substrate may further include a first substrate, the plurality of LEDs may be provided on the first substrate, and at least a portion of the conductive pattern may be provided on at least one side surface of the first substrate.

The integrated substrate may further include a second substrate, the signal wiring layer may further include a plurality of scan lines and a plurality of data lines provided on the second substrate, and the conductive pattern may be provided on at least one surface of the second substrate.

The LED module may further include a plate on a surface of the glass substrate, the plate being connected to the conductive pattern, and the conductive pattern may be connected to the ground through the plate.

The signal wiring layer may further include at least one via hole penetrating the glass substrate; and a plurality of reference electrodes, wherein the conductive pattern is connected to the plurality of reference electrodes through the at least one via hole, and is connected to the ground through at least one of the plurality of reference electrodes.

The conductive pattern may be electrically isolated from the plurality of LEDs and the plurality of signal electrodes.

The conductive pattern may be connected to the ground through an external component.

The signal wiring layer may further include an upper signal wiring layer provided between the plurality of LEDs and a first surface of the glass substrate; and a lower signal wiring layer connected to the upper signal wiring layer and provided on a second surface of the glass substrate, the second surface facing opposite to the first surface of the glass substrate.

The LED module may further include a side wiring configured to connect the upper signal wiring layer to the lower signal wiring layer.

In accordance with an aspect of the disclosure, there is provided a light emitting diode (LED) module, including: a glass substrate including a pair of surfaces and a plurality of side surfaces between the pair of surfaces; an upper signal wiring layer provided on the glass substrate and including a plurality of signal electrodes configured to supply a data signal to a plurality of LEDs and a plurality of reference electrodes configured to ground the plurality of LEDs; a lower signal wiring layer connected to the upper signal wiring layer, the lower signal wiring layer provided below the glass substrate; a side wiring provided on at least one first surface of the LED module and configured to connect the upper signal wiring layer to the lower signal wiring layer: and a conductive pattern provided on at least one second surface of the LED module, different from the at least one first surface, the conductive pattern being connected to at least one of the plurality of reference electrodes.

At least a portion of the conductive pattern may be provided on at least one side surface of the upper signal wiring layer.

At least a portion of the conductive pattern may be provided on at least one side surface of the lower signal wiring layer.

The LED module may further include at least one plate provided on a surface of the glass substrate, and connected to the conductive pattern, wherein the conductive pattern is connected to a ground through the at least one plate.

The glass substrate may further include at least one via hole penetrating the pair of surfaces, wherein the conductive pattern is connected to the at least one of the plurality of reference electrodes through the at least one via hole.

The conductive pattern may be electrically isolated from the plurality of LEDs and the plurality of signal electrodes.

In accordance with an aspect of the disclosure, there is provided a light emitting diode (LED) module including: a glass substrate including a pair of surfaces and four side surfaces between the pair of surfaces; a plurality of LEDs provided on the glass substrate; a signal wiring layer electrically connected to the plurality of LEDs; a driving signal wiring layer provided on a lower surface of the glass substrate; a side wiring provided on a first side surface of the glass substrate and a second side surface of the glass substrate, the second side surface facing opposite to the first side surface, the side wiring being configured to electrically connect the signal wiring layer to the driving signal wiring layer; and a conductive pattern provided on a third side surface of the glass substrate and a fourth side surface of the glass substrate that are different from the first side surface and the second side surface, the third side surface facing opposite to the fourth side surface, the conductive pattern being connected to a ground.

A reference electrode may be included in at least one of the signal wiring layer and the driving signal wiring layer, and the conductive pattern may be electrically connected to the reference electrode.

The glass substrate may have a rectangular shape, and the pair of surfaces may include flat surfaces.

The conductive pattern may be electrically isolated from the plurality of LEDs, the signal wiring layer, and the driving signal wiring layer.

The conductive pattern may have a capacitance larger than a capacitance of the side wiring and an impedance lower than an impedance of the side wiring.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
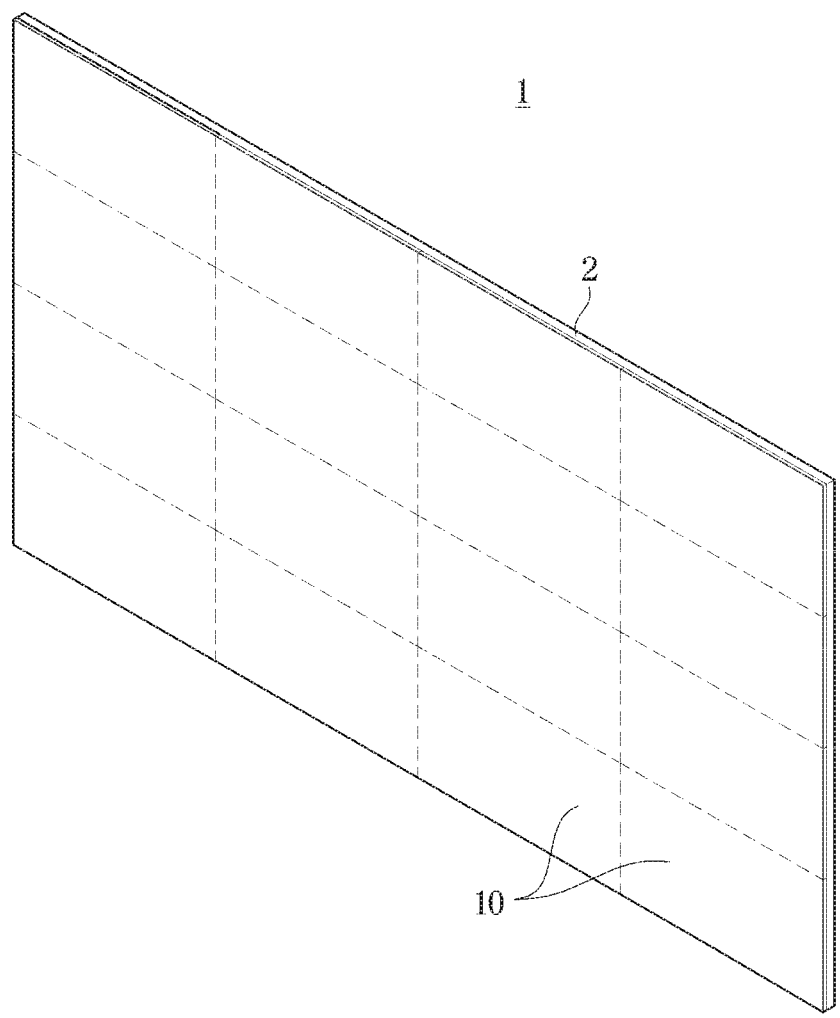
FIG. 1 is a perspective view of a display apparatus according to an embodiment.

Embodiments described in the disclosure and configurations shown in the drawings are merely examples of the embodiments of the disclosure, and may be modified in various different ways at the time of filing of the present application to replace the embodiments and drawings of the disclosure.

The terms used herein are used to describe the embodiments and are not intended to limit and/or restrict the disclosure.

The singular forms "a," "an" and "the" are intended to include the plural forms as well, unless the context clearly indicates otherwise.

In the disclosure, the terms "comprising," "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms "first," "second," "third," etc., may be used herein to describe various elements, but elements are not limited by these terms.

In addition, terms such as "unit", "part", "block", "member", and "module" indicate a unit for processing at least one function or operation and may represent at least one hardware such as a Field Programmable Gate Array (FPGA), an Application Specific Integrated Circuit (ASIC), at least one software stored in a memory, and/or at least one process processed by a processor.

The disclosure will be described more fully hereinafter with reference to the accompanying drawings. Like reference numerals refer to like elements throughout the description. Well-known functions or constructions are not described in detail since they would obscure the one or more example embodiments with unnecessary detail. The relative size and depiction of these elements may be exaggerated for clarity, illustration, and convenience.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present.

Also, when a given layer of a material is described as being on a substrate or other layer, the material layer may be in direct contact with the substrate or the other layer, and another third layer may be present therebetween. In addition, in the examples below, the materials forming each layer are example, and other materials may be used.

Hereinafter, a display apparatus includes any apparatus capable of providing an image to a user by displaying the image. For example, the display apparatus may include, for example but not limited to, a television, a monitor, a laptop computer and a display device of a mobile communication terminal.

Figure 2:
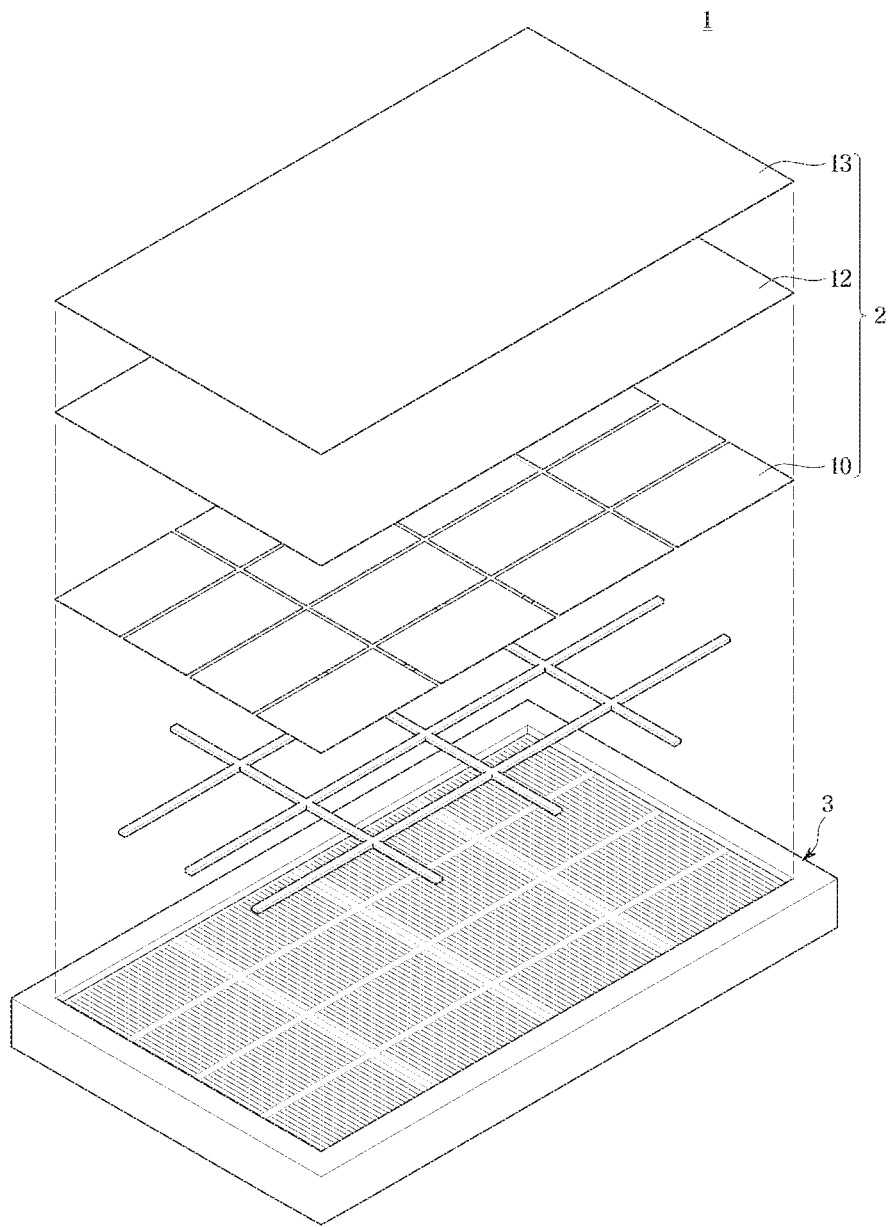
FIG. 2 is an exploded perspective view of a display panel used in a display apparatus according to an embodiment.

FIG. 1 is a perspective view of a display apparatus according to an embodiment, and FIG. 2 is an exploded perspective view of a display panel used in a display apparatus according to an embodiment.

Referring to FIG. 1, a display apparatus 1 includes a display panel 2 on which a screen is displayed, and a case 3 (refer to FIG. 3) configured to support the display panel 2 and provide a rear surface and/or a side surface of the display apparatus. The display panel 2 may be implemented with at least one light emitting diode (LED) module 10.

Referring to FIG. 2, the display panel 2 may include the LED modules 10 arranged in columns and rows in an M×N matrix form, a fixing member 12 configured to allow the LED modules 10 to be fixed in the matrix form, and a glass panel 13 arranged on the front side of the LED modules 10 through the fixing member 12.

FIG. 2 illustrates that the LED modules 10, the fixing member 12, and the glass panel 13 are separable from each other. However, in an embodiment, the LED modules 10 and the glass panel 13 may be integrally formed through the fixing member 12 therebetween, thereby forming the display panel 2.

That is, according to an embodiment, the display apparatus 1 may include a glass plate (or a glass substrate), a plurality of light emitting diodes (LEDs), and a signal wiring layer arranged on the glass substrate and including a plurality of signal electrodes configured to supply a data signal to each of the plurality of LEDs and a plurality of reference electrodes configured to ground the plurality of LEDs.

According to an embodiment, a conductive pattern may be formed on at least one surface of an integrated substrate implemented by the glass substrate, the plurality of LEDs, and the signal wiring layer.

The conductive pattern may be connected to at least one of the plurality of reference electrodes or the ground.

In addition, the display apparatus 1 may further include a glass panel provided on the front surface of the integrated substrate and a fixing member configured to fix the integrated substrate.

Figure 3:
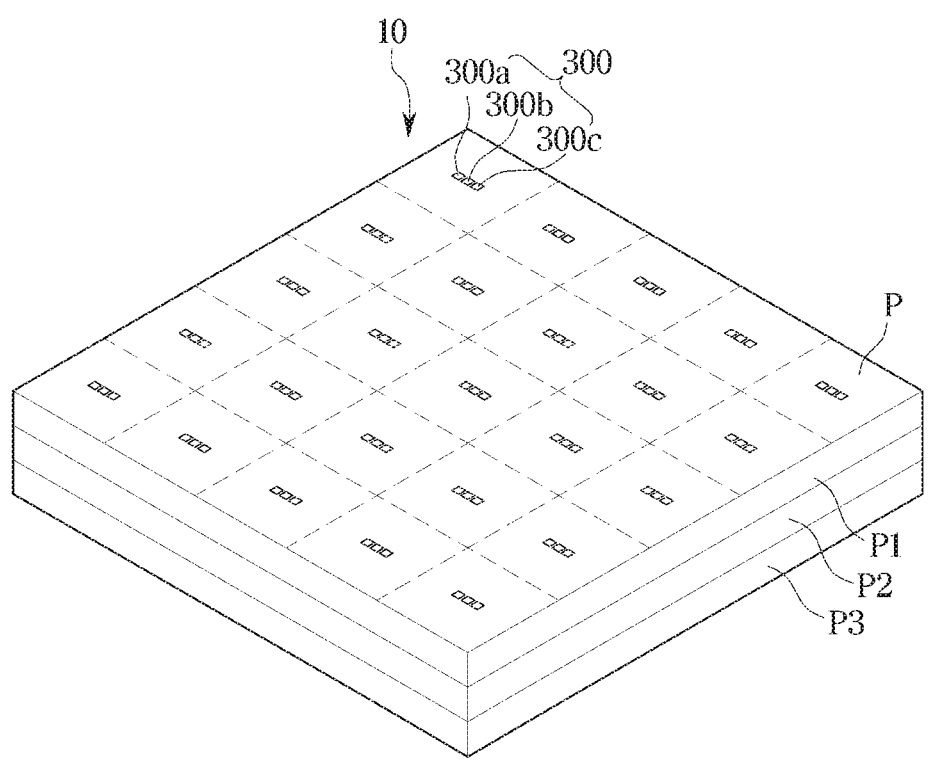
FIG. 3 is a view illustrating a display panel provided with a light emitting diode (LED) module according to an embodiment.

FIG. 3 is a view illustrating a display panel provided with a light emitting diode (LED) module according to an embodiment.

Referring to FIG. 3, the LED module 10 includes a glass substrate P3 and a plurality of LEDs 300 mounted on the glass substrate P3.

The glass substrate P3 may include a transparent material such as glass, and may form a plurality of pixel regions P. According to an embodiment, a circuit and an element mounted on a glass base may be mounted in a chip on glass (COG) type. Particularly, the COG type may be a method of directly embedding a driver integrated circuit on a glass substrate of a liquid crystal panel, to achieve an ultra-thin and lightweight fine-pitch of the display panel.

A signal wiring layer P2 is a thin-film transistor (TFT) substrate, and a thin film transistor and various wirings for driving the LED 300 may be formed corresponding to the pixel region P. When the thin film transistor is turned on, a driving signal input from the outside through the wiring is applied to the LED 300 and thus the LED 300 emits light to implement an image.

Referring to FIG. 3, the LED module 10 may include the glass substrate P3, a TFT array substrate P2 including a plurality of signal electrodes configured to supply a data signal to each LED 300 and a plurality of reference electrodes configured to ground the plurality of LEDs 300, and a substrate P1 including the LED 300.

According to an embodiment, the LED 300 may have a size of 10-100 µm, and the LED 300 may be formed in such a way that a thin film growth method is performed with an inorganic material such as Al, Ga, N, P, As and In, on a sapphire substrate or a silicon substrate and then the sapphire substrate or the silicon substrate is cut out and separated. Accordingly, the LED 300 may have a fine size.

A plurality of gate lines and data lines may be arranged in vertical and horizontal directions to define the plurality of pixel regions P in a matrix form. In this case, the gate line and the data line may be connected to the LED 300, and end portions of the gate line and the data line may be respectively provided with a gate pad and a data pad connected to the outside, and the gate pad and the data pad may be formed in a side wiring in the above mentioned LED module 10.

The LED 300 may be operated based on an external signal applied to the LED 300 through the gate line and the data line.

Figure 4:
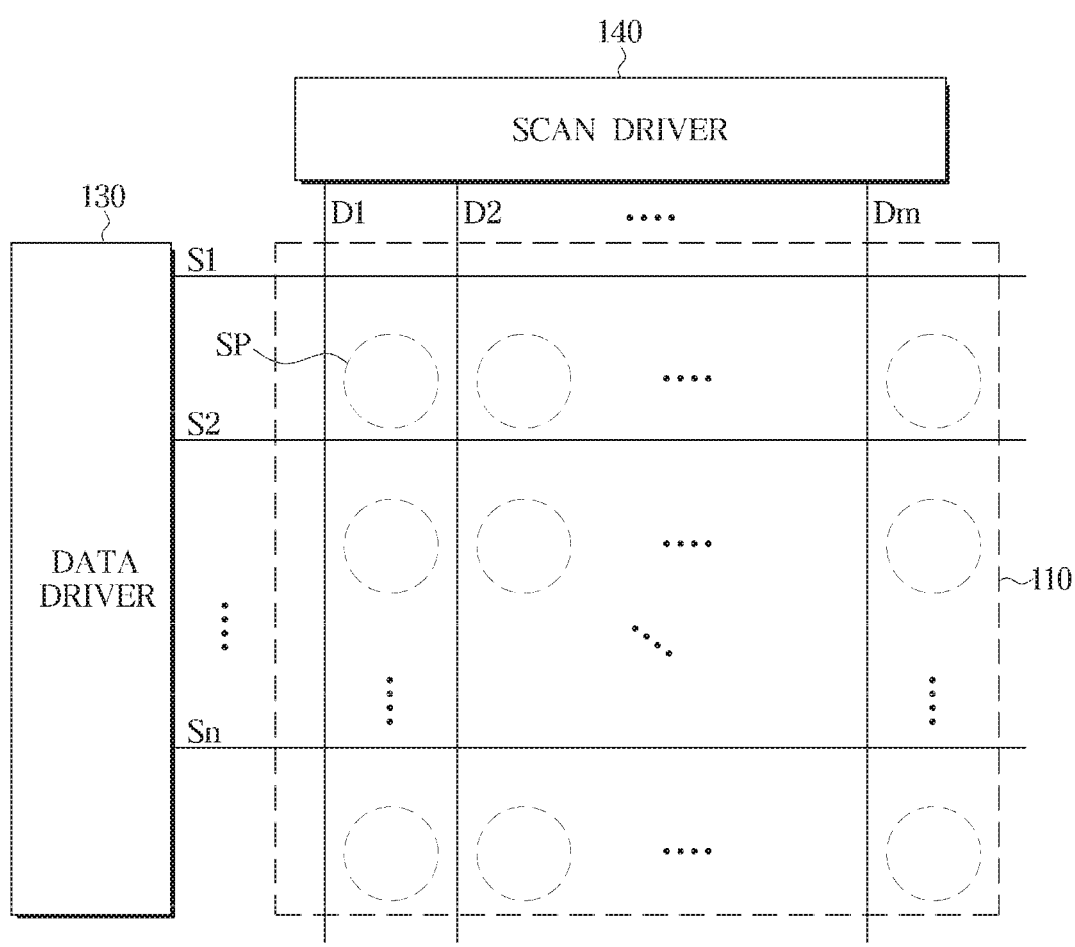
FIG. 4 is a schematic view illustrating a configuration of an LED module according to an embodiment.

FIG. 4 is a schematic view illustrating a configuration of the LED module according to an embodiment.

Referring to FIG. 4, a plurality of data lines D1-Dm, a plurality of scan lines S1-Sn and a plurality of pixel circuits may be provided as an electrode pattern on one surface of the LED module. A pixel region SP may represent a region that is defined by an intersection between adjacent data lines and scan lines of the data lines D1-Dm and the scan lines S1-Sn, and may be provided with a pixel circuit. The plurality of pixel regions SP may be grouped into a pixel, and one color represented by a corresponding pixel may be selected by mixing the respective light generated in one pixel region SP.

The data lines D1-Dm may transmit a data signal representing an image signal to a corresponding pixel circuit of the pixel region SP, and the scan lines S1-Sn may transmit a scan signal to the corresponding pixel circuit of the pixel region SP.

A scan driver 140 may sequentially apply the scan signal to each of the plurality of scan lines S1-Sn arranged in a row direction, and A data driver 130 may sequentially apply a data voltage (VDATA) corresponding to the image signal to the plurality of data lines D1-Dm arranged in a column direction.

The scan driver 140 and/or the data driver 130 may be electrically connected to a display panel 110, or may be mounted to a tape carrier package (TCP), which is bonded to the display panel 110 and then electrically connected to the display panel 110, in the form of chip. Alternatively, the scan driver 140 and/or the data driver 130 may be mounted to a Flexible Printed Circuit (FPC) or film, which is bonded to the display panel 110 and then electrically connected to the display panel 110, in the form of chip. In addition, the scan driver 140 and/or the data driver 130 may be directly mounted to the substrate of the LED module 10.

Figure 5:
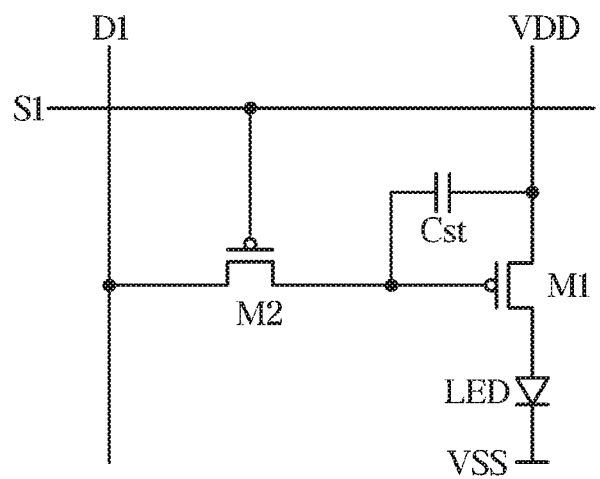
FIG. 5 is a circuit diagram illustrating a circuit provided in a pixel region of the display panel of FIG. 4.

FIG. 5 is an equivalent circuit diagram illustrating a pixel circuit of the pixel region of FIG. 4. Particularly, FIG. 5 illustrates a pixel circuit driven by a first scan line S and a first data line D1.

Referring to FIG. 5, the pixel circuit may include an LED, two transistors M1 and M2, and a capacitor Cst. The plurality of transistors M1 and M2 may be provided as PMOS transistors. However, such a circuit configuration is based on an active matrix (AM) driving method, which is merely an example of the pixel circuit. Therefore, the pixel circuit is not limited to the circuit configuration of FIG. 4.

As for a switching transistor M2, a gate electrode may be connected to the scan line Sn, a source electrode may be connected to the data line Dm, a drain electrode may be connected to a first end of the capacitor Cst and a gate electrode of a driver transistor M1, and a second end of the capacitor Cst may be connected to a power voltage VDD. As for the driver transistor M1, a source electrode may be connected to the power voltage VDD, a drain electrode may be connected to an anode 310 (refer to FIG. 6) of the LED, and a cathode 390 (refer to FIG. 6) of the LED may be connected to a reference voltage VSS through reference electrodes 250-1 and 250-2 (refer to FIG. 6). Accordingly, the LED may emit light based on a current applied from the driver transistor M1. The reference voltage VSS connected to the cathode 390 of the LED may be lower than the power voltage VDD and thus a ground voltage may be used as the reference voltage VSS.

According to an embodiment, the power supply provided in the LED may supply the power voltage VDD to the LED module and be connected to the reference voltage VSS.

An operation of the pixel circuit according to an embodiment is described. First, when the scan signal is applied to the scan line Sn and the switching transistor M2 is turned on, the data voltage may be transmitted to the first end of the capacitor Cst and the gate electrode of the driver transistor M1. As a result, a gate-source voltage VGS of the driver transistor M1 may be maintained for a predetermined period of time, by the capacitor Cst. In addition, the driver transistor M1 may allow the LED to emit light by applying a current ILED corresponding to the gate-source voltage VGS of the driver transistor M1 to the anode 310 of the LED.

When a high data voltage VDATA is transmitted to the gate electrode of the driver transistor M1, the gate-source voltage VGS of the driver transistor M1 may be lowered. Accordingly, a small amount of the current ILED may be applied to the anode 310 of the LED and thus the LED may emit light having a less intensity. Therefore, the LED may display a low gradation. On the other hand, when a low data voltage VDATA is transmitted to the gate electrode of the driver transistor M1, the gate-source voltage VGS of the driver transistor M1 may be increased. Accordingly, a large amount of the current ILED may be applied to the anode 310 of the LED and thus the LED may emit light having a greater intensity. Therefore, the LED may display a high gradation. Thus, a level of data voltage VDATA applied to each pixel circuits may be selected based on an image to be displayed.

Figure 6:
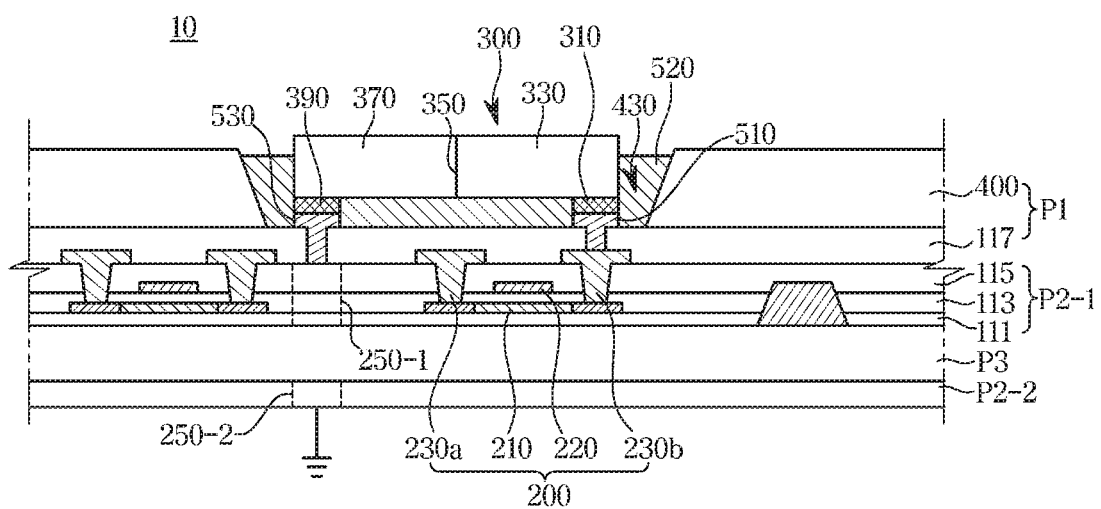
FIG. 6 is a cross-sectional view illustrating an arrangement structure of a pixel region of a display panel according to an embodiment.

An embodiment of a cross section of the pixel region SP is illustrated in FIG. 6.

FIG. 6 is a view illustrating an arrangement structure of a pixel region of a display panel according to an embodiment. FIG. 6 illustrates a case in which one of two transistors 200 is connected to the LED 300.

The glass substrate P3 may include various materials. For example, the glass substrate P3 may be formed of a transparent glass material containing SiO2 as a main component, but the glass substrate P3 is not limited thereto. Therefore, the glass substrate P3 may be formed of transparent plastic material and thus the glass substrate P3 may have flexibility. The plastic material may be an insulating organic material selected from a group consisting of polyethersulphone (PES), polyacrylate (PAR), polyetherimide (PEI), polyethylenenaphthalate (PEN), polyethylene terephthalate (PET), polyphenylene sulfide (PPS), polyallylate, polyimide, polycarbonate (PC), cellulose triacetate (TAC), and cellulose acetate propionate (CAP).

A buffer layer 111 may be formed on the glass substrate P3. The buffer layer 111 may provide a flat surface on top of the glass substrate P3 and may prevent a foreign materials or moisture from being introduced to the glass substrate P3. For example, the buffer layer 111 may be formed of an inorganic material such as silicon oxide, silicon nitride, silicon oxynitride, aluminum oxide, aluminum nitride, titanium oxide or titanium nitride, or an organic material such as polyimide, polyester, or acrylic. Alternatively, the buffer layer 111 may be formed by a plurality of laminated layers of the inorganic material as mentioned above.

The transistor 200 may be provided on the buffer layer 111.

The transistor 200 may include an active layer 210, a gate electrode 220, a source electrode 230a and a drain electrode 230b. The active layer 210 may include a semiconductor material, and the active layer 210 may include a source region, a drain region, and a channel region between the source region and the drain region. The gate electrode 220 may be formed on the active layer 210 to correspond to the channel region. The source electrode 230a and the drain electrode 230b may be electrically connected to the source region and the drain region of the active layer 210, respectively. A first insulating layer 113 formed of an inorganic insulating material may be arranged as a gate insulating film between the active layer 210 and the gate electrode 220. A second insulating layer 115 may be arranged as an interlayer insulating film between the gate electrode 220 and the source electrode 230a and between the gate electrode 220 and the drain electrode 230b. A third insulating layer 117 may be arranged as a planarization film on the source electrode 230a and the drain electrode 230b. The second insulating layer 115 and the third insulating layer 117 may be formed of an organic insulating material or an inorganic insulating material. Alternatively, the second insulating layer 115 and the third insulating layer 117 may be formed by alternating the organic insulating material and the inorganic insulating material.

FIG. 6 illustrates that the transistor 200 is implemented in a top gate type in which a gate electrode is arranged on top of the active layer, but the disclosure is not limited thereto. In an embodiment, the gate electrode may be arranged below the active layer.

The buffer layer 111, the first insulating layer 113, the second insulating layer 115, the third insulating layer 117, and the transistor 200 may form a signal wiring layer including the scan line and the data line described above. According to an embodiment, the signal wiring layer may be formed in a thin film transistor (TFT) substrate.

In the embodiment of FIG. 6, a layer including the LED 300 is referred to as a first substrate P1, and a layer including the scan line and the data line and including the buffer layer 111, the first insulating layer 113, the second insulating layer 115, the third insulating layer 117 and the transistor 200 is referred to as a second substrate. The second substrate may include an upper signal wiring layer P2-1 and a lower signal wiring layer P2-2.

The first substrate P1, the second substrate including the layers P2-1, P2-2, and the glass substrate P3 may form an integrated substrate.

In addition, although the LED 300 is described as a flip type, a vertical type is also applicable.

A bank 400 defining the pixel region may be arranged on the third insulating layer 117. The bank 400 may include a concave portion 430 in which the LED 300 is to be accommodated. A height of the bank 400 may be selected based on a height and a viewing angle of the LED 300. A size (or a width) of the concave portion 430 may be selected based on a resolution and a pixel density of the display apparatus 1. According to an embodiment, the height of the LED 300 may be greater than the height of the bank 400.

FIG. 6 illustrates that the concave portion 430 is in a quadrangle shape, but is not limited thereto. Therefore, the concave portion 430 may have various shapes such as a polygonal shape, a rectangular shape, a circular shape, a conical shape, an elliptical shape and a triangle shape.

A signal electrode 510 may be arranged along a side surface and a bottom surface of the concave portion 430 and an upper surface of the bank 400 around the concave portion 430. The signal electrode 510 may be electrically connected to the source electrode 230a or the drain electrode 230b of the transistor 200 through a via hole formed on the third insulating layer 117.

According to an embodiment, a conductive pattern to be described later may be connected to the ground together with the reference electrode through a via hole.

The bank 400 may act as a light blocking portion having a low light transmittance so as to block light emitted toward the side surface of the LED 300. Therefore, the bank 400 may prevent color of light, which is emitted from the LED 300 adjacent to each other, from being mixed. In addition, the bank 400 may improve a bright room contrast of the display apparatus 1 by absorbing and blocking the light incident from the outside. The bank 400 may include a material that absorbs at least some beams of the light, a light reflective material, and/or a light scattering material.

The bank 400 may include a semi-transparent or opaque insulating material for visible light (e.g., light in a wavelength range from 380 nm to 750 nm). The bank 400 may be formed of thermoplastic resin such as polycarbonate (PC), polyethylene terephthalate (PET), polyethersulfone, polyvinyl butyral, polyphenylene ether, polyamide, polyether imide, norbornene system resin, methacrylic resin, or cyclic polyolefin-based resin, thermosetting resin such as an epoxy resin, a phenol resin, a urethane resin, an acrylic resin, a vinyl ester resin, an imide-based resin, a urethane-based resin, a urea resin or a melamine resin, or organic insulating material such as polystyrene, polyacrylonitrile, or polycarbonate, but is not limited thereto.

Alternatively, the bank 400 may be formed of an inorganic insulating material such as an inorganic oxide such as SiOx, SiNx, SiNxOy, AlOx, TiOx, TaOx, or ZnOx, or inorganic nitride, but is not limited thereto.

According to an embodiment, the bank 400 may be formed of an opaque material such as a black matrix material. An insulating black matrix material may include resin or pastes including organic resins, glass pastes and black pigments, metal particles such as nickel, aluminum, molybdenum and alloys thereof, metal oxide particles (e.g., chromium oxide) or metal nitride particles (e.g., chromium nitride). According to another embodiment, the bank 400 may be a distributed Bragg reflector (DBR) having high reflectivity or a mirror reflector formed of metal.

The LED 300 may be arranged on the concave portion 430 of the bank 400. The LED 300 may be a micro LED. Micro LED may have a size of 1 to 100 μm, but the LED 300 is not limited thereto. Therefore, the LED 300 may employ an LED that is greater or less than the size of 1 to 100 μm. The LED 300 may be individually or collectively picked up from the wafer by a transfer mechanism and transferred to the glass substrate P3 so as to be accommodated in the concave portion 430 of the glass substrate P3. According to an embodiment, the LED 300 may be accommodated in the concave portion 430 of the glass substrate P3 after the bank 400 and the signal electrode 510 are formed. The LED 300 may emit light of a predetermined wavelength within a wavelength range from ultraviolet light to visible light. For example, the LED 300 may be a red, green, blue, white LED or ultraviolet (UV) LED.

The LED 300 may include a p-n diode, the anode 310 and the cathode 390. The anode 310 and/or the cathode 390 may be formed of a variety of conductive materials, including a metal, a conductive oxide and a conductive polymer. The anode 310 may be electrically connected to the signal electrode 510, and the cathode 390 may be electrically connected to the common electrode 530. The p-n diode may include a p-doped portion 330 in the anode 310 side, one or more quantum well part 350 and an n-doped portion 370 in the cathode 390 side. Alternatively, a doped portion in the cathode 390 side may correspond to the p-doped portion 330, and a doped portion in the anode 310 side may correspond to the n-doped portion 370.

A passivation layer 520 may be provided to surround the LED 300 in the concave portion 430. The passivation layer 520 may be disposed between the bank 400 and the LED 300. The passivation layer 520 may include an organic insulating material. For example, the passivation layer 520 may be formed of acrylic, poly methyl methacrylate (PMMA), benzocyclobutene (BCB), polyimide, acrylate, epoxy and polyester, but is not limited thereto.

Each of the LED 300 included in the display apparatus 1 may emit a unique color. In this case, each of the plurality of LEDs included in one pixel region P may be connected to different signal electrodes and may be provided to share one common electrode 530.

The signal wiring layer may include the upper signal wiring layer P2-1 disposed above the glass substrate P3 and the lower signal wiring layer P2-2 disposed below the glass substrate P3.

The reference electrodes 250-1 and 250-2 may be provided on at least one of the upper signal wiring layer P2-1 and the lower signal wiring layer P2-2.

Regardless of the position of the reference electrodes 250-1 and 250-2 that are provided on the upper and/or lower signal wiring layer, the upper and lower signal wiring layers P2-1 and P2-2 may be connected to each other.

In FIG. 6, the reference electrode is conceptually illustrated as an electrode arranged in the signal wiring layer. However, an embodiment is not limited thereto as long as the diode is an electrode of a wiring connected to the reference voltage.

Regardless of a method in which the upper signal wiring layer P2-1 and the lower signal wiring layer P2-2 are connected, the reference electrode provided in the upper and lower wiring layers P2-1 and P2-2 may be shared. The reference electrode may be connected to the ground.

As will be described later, the upper signal wiring layer P2-1 and the lower wiring layer P2-2 may be connected to each other in various manners.

Figure 7A:
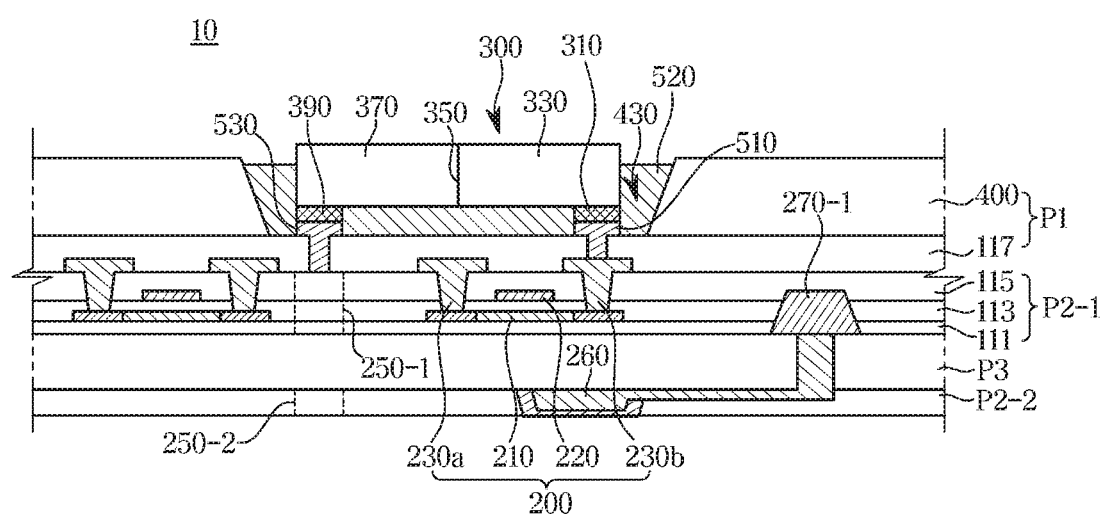
FIG. 7A is a cross-sectional view illustrating a configuration in which an upper signal wiring layer is connected to a lower wiring layer signal according to an embodiment.
Figure 7B:
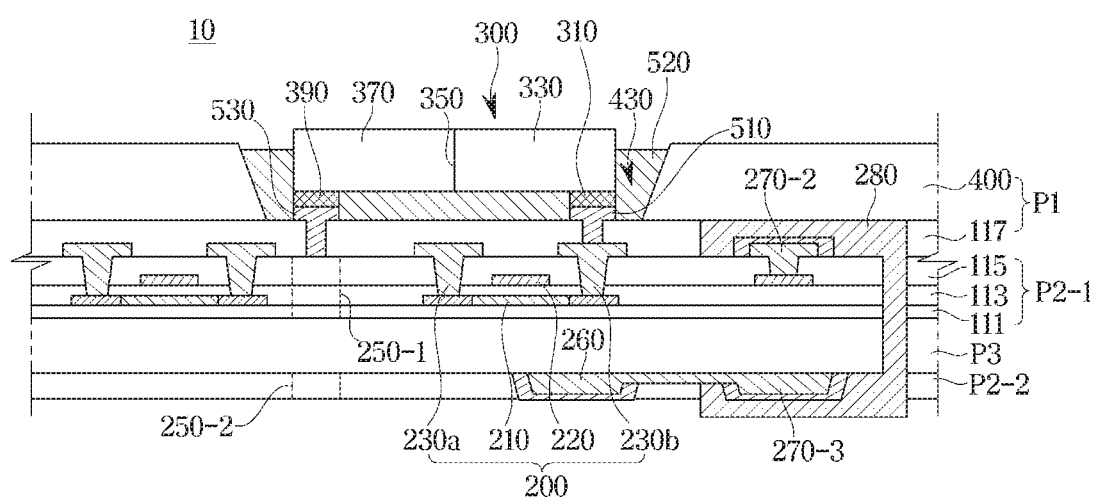
FIG. 7B is a cross-sectional view illustrating a configuration in which an upper signal wiring layer is connected to a lower wiring layer signal according to an embodiment.

FIGS. 7A and 7B are cross-sectional views illustrating a configuration in which an upper signal wiring layer is connected to a lower wiring layer signal according to an embodiment.

FIG. 7A illustrates that the upper signal wiring layer P2-1 is connected to the lower signal wiring layer P2-2 through the glass substrate P3.

The connection structure between the upper signal wiring layer P2-1 and the lower wiring layer P2-2 illustrated in FIG. 7A may be referred to as a through glass via (TGV) method.

According to an embodiment, the upper signal wiring layer P2-1 may be connected to the lower signal wiring layer P2-2 through a via hole formed in the glass substrate P3.

Particularly, a pad 270-1 provided in the upper signal wiring layer P2-1 may be connected to a flexible printed circuit pad 260 provided in the lower signal wiring layer P2-2 through the via hole.

The flexible circuit board pad 260 may be connected to an external component of the LED module 10.

In this case, a conductive pattern may be connected to the ground through the wiring of the via hole formed in the glass substrate P3. In addition, the conductive pattern may be connected to the reference electrode 250-2 provided in the lower signal wiring layer P2-2.

FIG. 7B illustrates that the upper signal wiring layer P2-1 is connected to the lower signal wiring layer P2-2 through a separate side wiring 280.

Particularly, a side wiring pad 270-2 of the upper signal wiring layer P2-1 may be connected to a side wiring pad 270-3 of the lower signal wiring layer P2-2 through the side wiring 280.

Particularly, the side wiring 280 may connect pads of upper and lower portions of the glass substrate P3 to each other.

When the upper signal wiring layer P2-1 is connected to the lower signal wiring layer P2-2 through the side wiring 280, the conductive pattern may be formed on a surface of the integrated substrate in which the side wiring 280 is not formed. Detailed description thereof will be described later.

As illustrated in FIG. 7A, the flexible circuit board pad 260 may be provided in the lower signal wiring layer P2-2, and connected to the external component of the LED module 10.

Further, the conductive pattern may be connected to the reference electrode 250-2 provided in the lower signal wiring layer P2-2.

Referring again to FIG. 7B, according to an embodiment, the LED module 10 may be provided in a structure in which at least one layer is laminated.

An upper layer contained in the LED module 10 may be provided on the upper surface of the glass substrate P3 so as to fix the plurality of LEDs 300.

In addition, the upper layer of the LED module 10 may include the plurality of signal electrodes configured to supply a data signal to the plurality of LEDs 300 and the plurality of reference electrodes configured to ground the plurality of LEDs 300.

The upper layer of the LED module 10 may include the upper signal wiring layer P2-1. The upper layer of the LED module 10 may include the first substrate P1 and the upper signal wiring layer P2-1.

A lower layer of the LED module 10 may include the lower signal wiring layer P2-2 connected to the upper signal wiring layer P2-1, and may be provided below the glass substrate P3.

The side wiring 280 may be configured to connect the upper signal wiring layer P2-1 to the lower signal wiring layer P2-2, according to an embodiment illustrated in FIG. 7B.

In addition, the conductive pattern may be provided on a side surface of the LED module 10 and connected to at least one of the plurality of reference electrodes.

The entire LED module 10 may be provided as a substrate structure, and the substrate structure may be provided to have an upper surface, a lower surface, and a side surface.

The side wiring 280 may be provided on a part of the side surface, and the conductive pattern may be provided on a surface of the LED module 10 in which the side wiring 280 is not provided.

At least a portion of the conductive pattern may be provided on at least one side surface of the upper layer of the LED module 10, and may be formed on at least one side surface of the lower layer of the LED module.

In addition, it should be understood that the above-described upper layer and lower layer of the LED module 10 may be a functional expression.

Particularly, the above-described upper layer and lower layer may be integrally formed on the substrate. The upper layer and the lower layer may be formed in a structure laminated on the substrate and by using a process of bonding a film and deposition and patterning using various conductors, semiconductors, and non-conductors based on the substrate. It should be understood by those skilled in the art that the range (e.g., width or thickness) of the upper layer and/or the lower layer may vary.

Figure 8A:
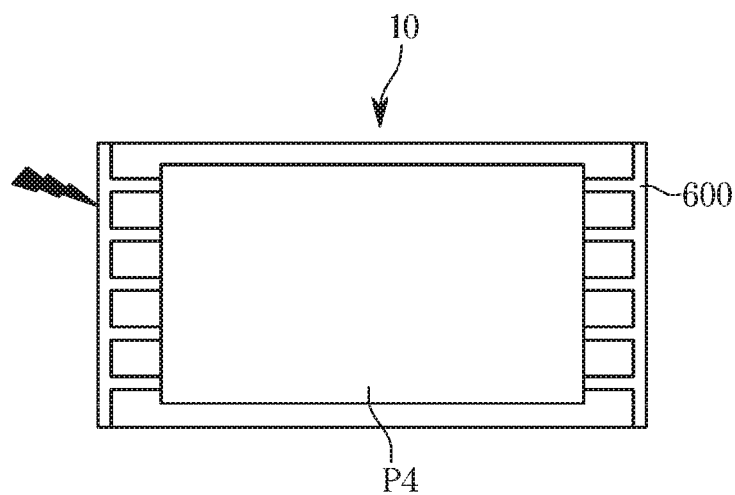
FIG. 8A is a plan view illustrating an implementation of a conductive pattern implemented on an LED module according to an embodiment.
Figure 8B:
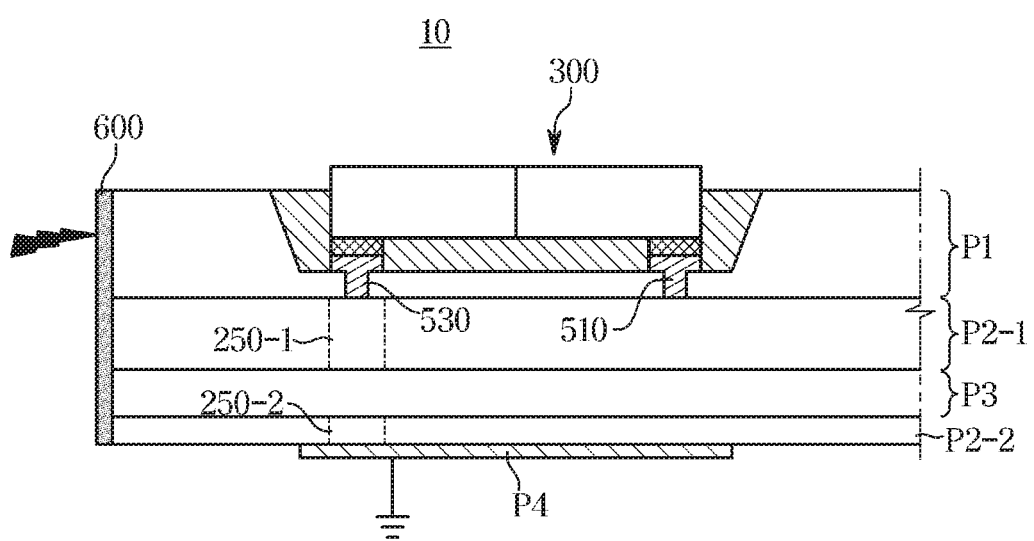
FIG. 8B is a cross-sectional view illustrating an implementation of a conductive pattern on an LED module according to an embodiment.

FIGS. 8A and 8B are respectively a plan view and a cross-sectional view of an LED module 10 to explain an implementation of the conductive pattern on the LED module 10 according to an embodiment.

Referring to FIGS. 8A and 8B, according to an embodiment, the LED module 10 may include ultra-small LEDs (e.g., a size of several micrometers (μm)).

According to an embodiment of the disclosure, the LED module 10 may include a conductive pattern 600 connected to the reference electrode independently of (or electrically isolated from) the plurality of LEDs and the plurality of signal electrodes.

In addition, in the implementation of the LED module 10, the conductive pattern 600 may be formed on a side surface of the LED module 10 to prevent damage to the LED 300.

When electrostatic discharge (ESD) occurs, a current may flow to the conductive pattern 600 and then flow to the ground. Therefore, the conductive pattern 600 may provide protection of the LED 300 and the signal wiring. Further, the conductive pattern 600 may have a larger capacitance and a lower impedance compared to the capacitance and the impedance of the side wiring.

In addition, the conductive pattern 600 may be provided electrically independently of (or electrically isolated from) the first substrate P1 including the LED 300 and the second substrate P2-1 and P2-2 including the plurality of signal electrodes.

The conductive pattern 600 may be provided around the LED 300 and the plurality of signal electrodes.

The conductive pattern 600 may be connected to the reference electrodes 250-1 and 250-2 independently of the plurality of signal electrodes. In addition, the conductive pattern 600 may be connected to a plate P4 provided in the LED module 10. The plate P4 may be connected to ground. For example, the plate P4 may be provided on a lower portion of the LED module 10, and FIG. 8A may be a plan view when viewed from a bottom of the LED module 10.

As mentioned above, when the ESD is applied to the LED module 10 in a state in which the conductive pattern 600 is connected to the ground, the ESD may flow to the ground through the conductive pattern 600 without affecting other circuits included in the LED module 10.

The conductive pattern 600 may be connected to the ground in various forms, of which an example is illustrated in FIG. 8B.

The conductive pattern 600 may be connected to the reference electrodes 250-1 and 250-2 independently of the plurality of signal electrodes, and the reference electrode may provide the ground. The signal wiring layer may include the upper signal wiring layer P2-1 and the lower wiring layer P2-2.

The reference electrode 250-2 may be provided on the lower signal wiring layer P2-2 and then connected to the conductive pattern 600.

The reference electrode provided on the lower signal wiring layer P2-2 may be connected to ground.

The conductive pattern 600 may be directly connected to the plate P4 provided under the LED module 10 through a separate wiring. According to an embodiment, the plate P4 may be connected to ground.

Therefore, the conductive pattern 600 may be connected to the ground through the plate P4.

The conductive pattern 600 may be connected to the reference electrode 250-2 by being connected to the wiring provided in the via hole provided in the lower signal wiring layer P2-2 through the wiring. The reference electrode 250-2 may be connected to the via hole provided in the lower signal wiring layer P2-2.

Therefore, the conductive pattern 600 may be connected to the reference electrode 250-2 through the via hole provided on the lower signal wiring layer P2-2, and connected to the ground.

According to another embodiment, a conductive pad may be connected to ground through an external component of the LED module 10. Detailed description thereof will be described below.

The LED module 10 may include a first substrate P1 including an LED 300 and a second substrate P2-1 and P2-2 on which a plurality of scan lines and a plurality of data lines are provided.

At least a portion of the conductive pattern 600 may be provided on at least one side surface of the first substrate.

When electrostatic discharge (ESD) occurs in the LED module 10, the ESD may be transferred to the conductive pattern 600 provided in the LED module 10 instead of the LED 300 and the signal electrode. The conductive pattern 600 may transfer the ESD to the connected ground. Based on this operation, the ESD applied to the LED module 10 may be transferred not to the LED and the signal electrode, but to the ground through the conductive pattern 600.

As mentioned above, the conductive pattern 600 may be independently provided without being connected to a circuit configuration of the LED module 10 in which a plurality of scan lines, a plurality of data lines, and the LED are connected.

It is described above that the conductive pattern 600 may be connected to the ground, thereby directly transferring the ESD to the ground. However, a form in which the conductive pattern 600 is connected to the ground is not limited thereto, and may vary as long as the conductive pattern 600 is implemented as being connected to the ground.

In addition, the operation described in FIGS. 8A and 8B is merely an example of protecting the LED module 10 of the disclosure, and the operation of transferring the ESD through the conductive pattern 600 may be performed in various manners.

FIGS. 9A, 9B, 10A, 10B, 11A, and 11B are views illustrating various implementations of the conductive pattern on the LED module 10.

Figure 9A:
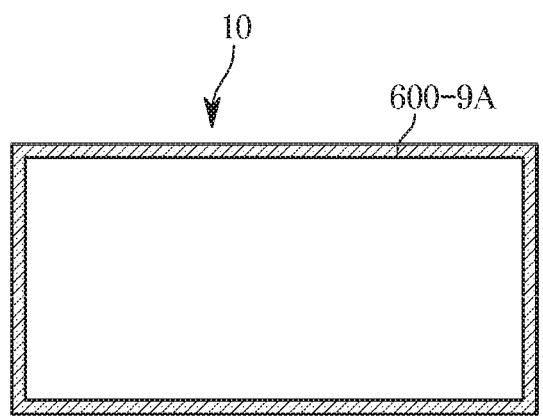
FIG. 9A is a plan view of an LED module according to an embodiment.
Figure 9B:
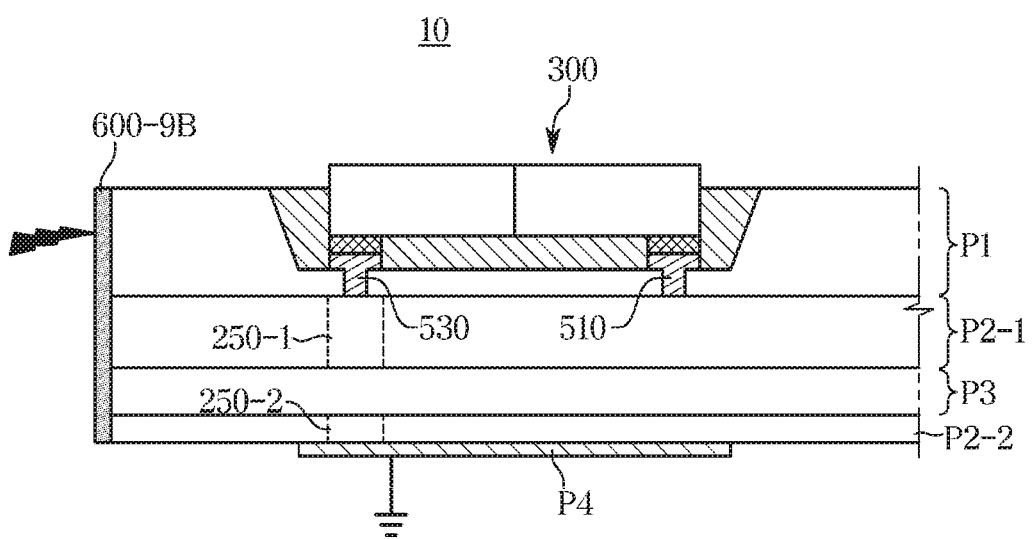
FIG. 9B is a cross-sectional view of an LED module according to an embodiment.

FIG. 9A is a plan view of an LED module 10 according to an embodiment, and FIG. 9B is a cross-sectional view of the LED module 10 according to an embodiment.

Referring to FIGS. 9A and 9B, conductive patterns 600-9a and 600-9b may be provided around the LED 300, and connected to ground.

When the conductive patterns 600-9A and 600-9B are connected to the ground, the conductive patterns 600-9A and 600-9B may eliminate ESD that occurs in the LED module 10. The conductive patterns 600-9A and 600-9B may be connected to reference electrodes 250-1 and 250-2.

The reference electrodes 250-1 and 250-2 may be connected to the reference voltage VSS. As described above, the conductive patterns 600-9A and 600-9B may be connected to the signal wiring layer, particularly, the reference electrode 250-2 of the lower signal wiring layer P2-2. According to an embodiment, the conductive patterns 600-9A and 600-9B may be directly connected to the reference electrode 250-2 provided in the lower signal wiring layer P2-2. According to an embodiment, the reference electrode may be connected to the conductive patterns 600-9A and 600-9B through the via hole provided in the lower signal wiring layer P2-2. Further, as described above, the conductive pattern 600-9A and 600-9B may be connected to the ground through the plate 4 provided in the LED module 10.

Figure 10A:
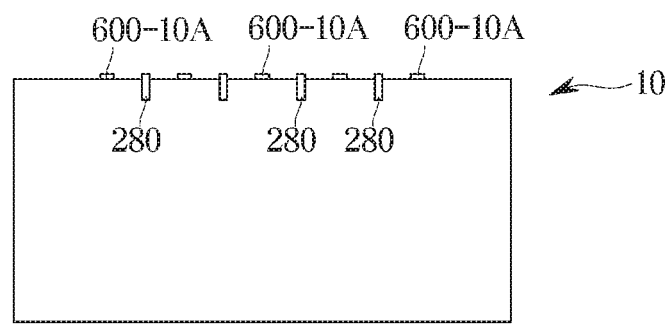
FIG. 10A is a plan view of an LED module according to an embodiment.
Figure 10B:
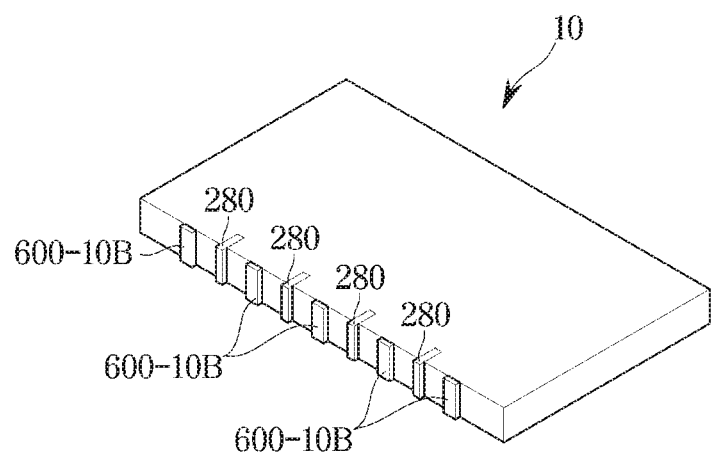
FIG. 10B is a perspective view of an LED module according to an embodiment.

FIG. 10A is a plan view of an LED module according to an embodiment, and FIG. 10B is a perspective view of the LED module according to an embodiment.

FIGS. 10A and 10B illustrate that at least a portion of the conductive pattern is provided on a side surface of an LED module 10. FIG. 0A illustrates that a conductive pattern 600-10A is provided on a side surface of a first substrate P1 and the periphery of the LED module 10.

Further, FIGS. 10A and 10B illustrate that the conductive pattern 600-10A or 600-10B is disposed on a position where a side wiring 280 is not positioned. The side wiring 280 may connect the upper signal wiring layer P2-1 provided above the glass substrate to the lower signal wiring layer P2-2 provided below the glass substrate. Details of the side wiring 280 have been described above, and repetitive descriptions thereof will be omitted.

The side wiring 280 and the conductive pattern 600-10A or 600-10B may be formed in a thin film structure on the side surface of the substrate structure contained in the LED module 10.

According to an embodiment, the side wiring 280 and the conductive pattern 600-10A or 600-10B may be formed in a form of a thin film, and may be formed in close contact with a side surface of the glass substrate contained in the LED module 10.

Conductive patterns 600-10A and 600-10B may be connected to the reference electrode and then connected to the ground. Particularly, the conductive patterns 600-10A and 600-10B may be connected to ground through the reference electrodes 250-1 and 250-2, but alternatively, may be connected to the ground through the plate P4 and the external component such as other frame and/or other substrate provided in the display apparatus.

The conductive pattern 600-10A may be provided in consideration of the positional relationship of the conductive pattern 600-10A with respect to the LED provided on the first substrate P1, and the signal electrode and the side wiring provided on the second substrate P2.

According to an embodiment, the signal electrode and the side wiring 280 may be provided on at least one surface of the LED module 10, and the conductive pattern 600-10A may be provided on the LED module 10 in an area in which the wiring of signal electrode is not provided.

In addition, the conductive pattern 600-10A may be connected to the reference electrode provided in the LED module 10. The conductive pattern 600-10A may be intermittently provided on the side surface of the first substrate P1. The conductive patterns 600-10A and 600-10B intermittently provided may be connected to the ground through one or more paths.

The conductive pattern 600-10B illustrated in FIG. 10B is formed intermittently while being formed on the side surface of the first substrate P1 on which the LED 300 are mounted, and thus the conductive pattern 600-10B may be connected to the ground through one or more paths.

Particularly, the plurality of reference electrodes may be provided in the signal wiring layer. Each of the reference electrodes may be connected to the ground. Therefore, the conductive pattern 600-10B intermittently provided may be connected to the ground by being connected to a plurality of reference electrodes.

The conductive pattern may be formed in consideration of the wiring position of the wiring of the signal electrode provided on the second substrate P2.

The configuration described in FIGS. 10A and 10B is merely an example of the disclosure. The configuration of the LED module and the conductive pattern may vary, as long as the conductive pattern may eliminate the ESD by being connected to the ground.

Figure 11A:
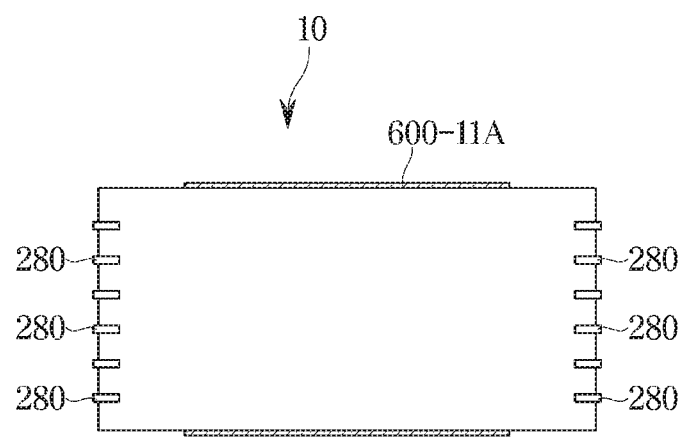
FIG. 11A is a plan view of an LED module according to an embodiment.
Figure 11B:
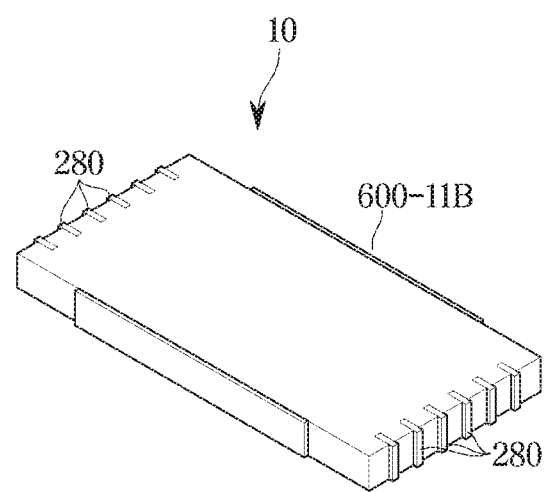
FIG. 11B is a perspective view of an LED module according to an embodiment.

FIG. 11A is a plan view of an LED module 10 according to an embodiment, and FIG. 11B is a perspective view of the LED module 10 according to an embodiment.

Referring to FIGS. 11A and 11B, a side wiring 280 configured to connect an upper signal wiring layer to a lower signal wiring layer may be provided as illustrated FIGS. 10A and 10B. In addition, conductive patterns 600-11A and 600-11B may be provided to avoid a surface of the LED in which the side wiring 280 is formed.

However, the conductive patterns 600-11A and 600-11B illustrated in FIGS. 11A and 11B may be continuously provided, which is different from FIGS. 10A and 10B. In FIGS. 11A and 11B, because the conductive patterns 600-11A and 600-11B are formed on a surface excluding a surface of the integrated substrate on which the side wiring 280 is formed, the conductive patterns 600-11A and 600-11B may be continuously provided.

In this case, the conductive patterns 600-11A and 600-11B may be connected to the ground without any limitation to the form of the conductive patterns 600-11A and 600-11B.

Particularly, according to an embodiment, the LED module 10 may include a glass substrate in a rectangular type.

The glass substrate may include a first surface and a second surface, and may include a plurality of side surfaces surrounding the first surface and second surface.

The first surface and the second surface may be provided to face each other, and side surfaces may be provided to surround the first surface and second surface.

Each of the first surface and the second surface may correspond to a flat surface of the glass substrate.

According to an embodiment, the first surface may correspond to an upper surface of the glass substrate and the second surface may correspond to a lower surface of the glass substrate.

According to another embodiment, the first surface may correspond to the lower surface, and the second surface may correspond to the upper surface.

In addition, according to an embodiment, the LED module 10 may include the plurality of LEDs arranged on the upper surface of the glass substrate, a signal wiring layer electrically connected to the LED, and a driving signal wiring layer provided on the lower surface of the glass substrate.

According to an embodiment, the side wiring 280 may be formed on first side surface of the glass substrate and a second side surface opposite to the first side surface of the glass substrate.

The side wiring 280 may electrically connect the signal wiring layer to the driving signal wiring layer. The conductive patterns 600-11A and 600-11B may be formed on a third side surface and a fourth side surface of the glass substrate, which are different from the first side surface and the second side surface of the glass substrate on which the side wiring 280 is provided, and connected to the ground so as to prevent the electrostatic discharge from being applied to the LED. The third surface may face opposite to the fourth surface.

Particularly, the side wiring 280 may be arranged in two side surfaces (e.g., the first side surface and the second side surface) of the LED module 10 provided as the rectangular substrate, and the two side surfaces may face to each other. The conductive patterns 600-11A and 600-11B may be arranged on the other side surface (e.g., the third side surface or the fourth side surface) of the LED module 10 in which the side wiring 280 is not provided.

The reference electrode may be included in at least one of the signal wiring layer and the driving signal wiring layer. In addition, the conductive pattern layer may be provided to be electrically connected to the reference electrode.

The implementations of the conductive pattern described in FIGS. 9 to 11 are merely examples, and the conductive pattern according to the disclosure may have various other forms and implementations as long as the conductive pattern may eliminate the ESD by being connected to the ground.

Figure 12:
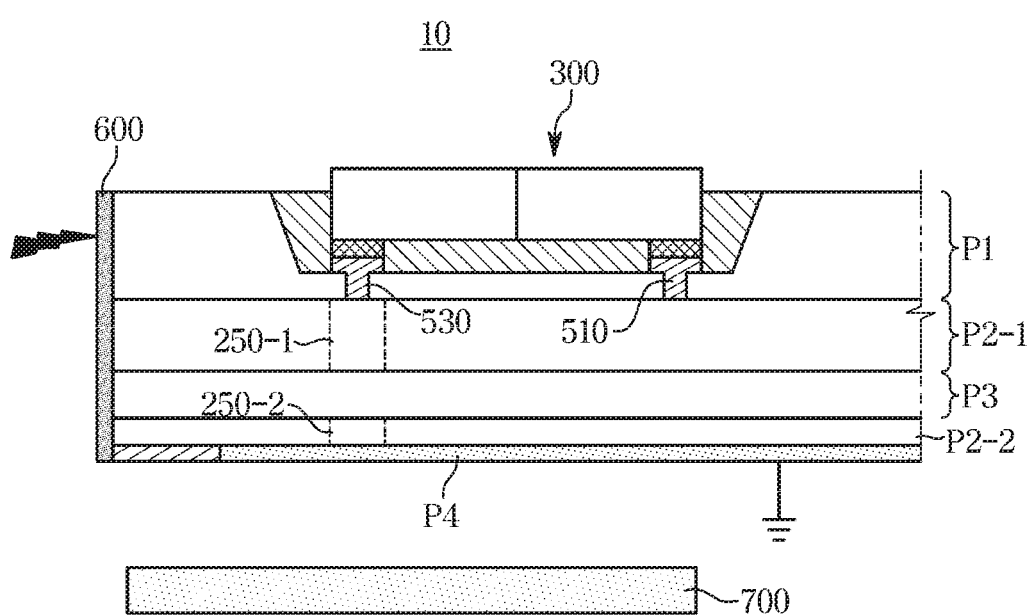
FIG. 12 is a cross-sectional view illustrating a power supply to an LED module according to an embodiment.
Figure 13:
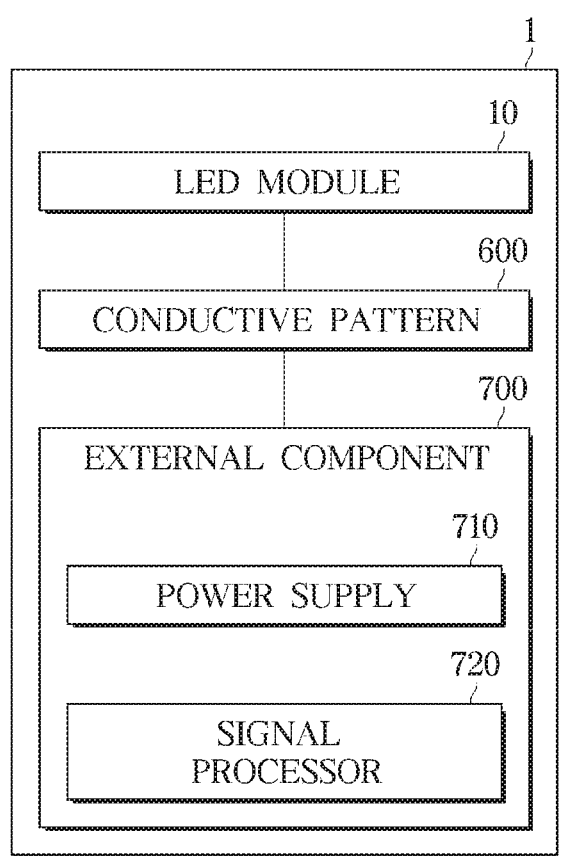
FIG. 13 is a block diagram of a display apparatus according to an embodiment.

FIG. 12 is a cross-sectional view illustrating a conductive pattern being connected to an external component according to an embodiment, and FIG. 13 is a block diagram of a display apparatus according to an embodiment.

Referring to FIGS. 12 and 13, the conductive pattern 600 may be formed on at least one surface of the second substrate P2-1 and P2-2. In addition, at least one surface of the second substrate P2-1 and P2-2 may include a conductive plate P4. The conductive pattern 600 may be connected to the ground by being connected to the conductive plate P4.

In addition, the ESD applied to the LED module 10 may be connected to an external component 700 via the conductive pattern 600. According to an embodiment, the external component 700 may be provided as a power supply provided in the display apparatus.

As illustrated in FIG. 13, the display apparatus 1 may include the plurality of LED modules 10, the conductive pattern 600, and the external component 700. The external component 700 may include a power supply 710 and a signal processor 720. The power supply 710 may be provided as a power supply device such as switching mode power supply (SMPS) for supplying power to drive the plurality of LED modules 10, and the signal processor 720 may be provided with a plurality of input signal port configured to receive an external signal, and a processor.

Therefore, according to an embodiment, the conductive pattern 600 may be electrically connected not to a component contained in the LED module 10, but to a ground of the external component 700.

As long as the external component 700 is connected to ground, the form of the external component 700 is not limited thereto.

The external component 700 may be connected to the ground through the conductive pattern 600 and the reference electrode 250-2.

According to another embodiment, the external component 700 may be connected to the ground through a signal wiring layer and a flexible printed circuit board.

In addition, because the ESD is transferred to the conductive plate P4 provided on a rear surface of the glass substrate, it is possible to prevent damage to the LED and the signal electrode provided in the LED module 10.

The conductive plate P4 may be connected to the ground provided in another substrate in the display apparatus 1. By using this structure, the conductive plate P4 may prevent ESD from being transferred back to the first substrate P1 and the second substrate P2-1 and P2-2. FIG. 12 illustrates that the conductive plate P4 is formed on the rear surface of the LED module 10, but is not limited thereto. Therefore, the conductive plate P4 may be formed on any surface of the LED module 10.

That is, the conductive pattern 600 may be connected to the ground through the external component 700 configured to ground the reference electrode 250-2.

According to the embodiments of the disclosure described above, the display apparatus and the LED module may prevent damage to an LED, which may be caused by electrostatic discharge, by implementing a conductive pattern in the LED module.

The disclosure may be embodied in the form of a computer-readable recording medium that stores instructions executable by a processor (or a computer). The instructions may be stored in the form of program code and, when executed by a processor, may generate a program module to perform operations of the embodiments. The computer-readable recording medium may be embodied as a computer-readable recording medium.

The non-transitory computer-readable recording medium includes all kinds of recording media in which instructions which can be decoded by a computer are stored. For example, there may be a Read Only Memory (ROM), a Random Access Memory (RAM), a magnetic tape, a magnetic disk, a flash memory, and an optical data storage device.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A light emitting diode (LED) module, comprising:
an integrated substrate comprising:
a plurality of LEDs;
a glass substrate comprising at least one via hole penetrating the glass substrate;
a signal wiring layer provided on the glass substrate, the signal wiring layer comprising a plurality of signal electrodes configured to supply a data signal to the plurality of LEDs and a plurality of reference electrodes configured to ground the plurality of LEDs; and
a conductive pattern provided on at least one surface of the integrated substrate,
wherein the conductive pattern is connected to at least one of the plurality of reference electrodes or a ground via an electronic path that is separate from an electronic path for supplying the data signal or grounding the plurality of LEDs,
wherein an electrostatic discharge (ESD) current flows to at least one of the plurality of reference electrodes or the ground through the conductive pattern, in response to an ESD,
wherein the integrated substrate further comprises a first substrate, on which the plurality of LEDs are provided, and a second substrate, wherein the signal wiring layer further comprises a plurality of scan lines and a plurality of data lines provided on the second substrate,
wherein the integrated substrate has a pair of surfaces and four side surfaces between the pair of surfaces,
wherein the plurality of LEDs are provided on one of the pair of surfaces of the integrated substrate,
wherein at least a portion of the conductive pattern is provided on at least one side surface among the four side surfaces of the integrated substrate, and
wherein at least the portion of the conductive pattern is provided on at least one side surface of the second substrate, and
wherein the conductive pattern is connected to the plurality of reference electrodes through the at least one via hole.

2. The LED module of claim 1, wherein at least another portion of the conductive pattern is provided on at least one side surface of the first substrate.

3. The LED module of claim 1, further comprising:
a plate on a surface of the glass substrate, the plate being connected to the conductive pattern,
wherein the conductive pattern is connected to the ground through the plate.

4. The LED module of claim 1,
wherein the conductive pattern is connected to the ground through at least one of the plurality of reference electrodes.

5. The LED module of claim 1, wherein the conductive pattern is connected to the ground through an external component.

6. The LED module of claim 1, wherein the signal wiring layer further comprises:
an upper signal wiring layer provided between the plurality of LEDs and a first surface of the glass substrate; and
a lower signal wiring layer connected to the upper signal wiring layer and provided on a second surface of the glass substrate, the second surface facing opposite to the first surface of the glass substrate.

7. The LED module of claim 6, further comprising:
a side wiring configured to connect the upper signal wiring layer to the lower signal wiring layer.

8. A light emitting diode (LED) module, in which at least one layer is laminated, comprising:
a glass substrate comprising a pair of surfaces and a plurality of side surfaces surrounding the pair of surfaces, the glass substrate further comprising at least one via hole penetrating the glass substrate;
an upper layer arranged on the glass substrate so as to fix a plurality of light emitting diodes (LEDs) and comprising an upper signal wiring layer comprising a plurality of signal electrodes configured to supply a data signal to a plurality of LEDs and a plurality of reference electrodes configured to ground the plurality of LEDs;
a lower layer comprising a lower signal wiring layer connected to the upper signal wiring layer, the lower signal wiring layer provided below the glass substrate;
a side wiring provided on at least one first side surface of the LED module and configured to connect the upper signal wiring layer to the lower signal wiring layer; and
a conductive pattern provided on at least one second side surface of the LED module, different from the at least one first side surface, the at least one second side surface including side surfaces of the glass substrate, the upper layer, and the lower layer, the conductive pattern being connected to at least one of the plurality of reference electrodes via an electronic path that is separate from an electronic path for supplying the data signal or grounding the plurality of LEDs, wherein an electrostatic discharge (ESD) current flows to at least one of the plurality of reference electrodes or the ground through the conductive pattern, in response to an ESD, and wherein the conductive pattern is connected to the plurality of reference electrodes through the at least one via hole.

9. The LED module of claim 8, further comprising:

at least one plate provided on a surface of the glass substrate, and connected to the conductive pattern, wherein the conductive pattern is connected to the ground through the at least one plate.

10. A light emitting diode (LED) module comprising:

a glass substrate comprising a pair of surfaces and four side surfaces between the pair of surfaces, the glass substrate further comprising at least one via hole penetrating the glass substrate;

a plurality of light emitting diodes (LEDs) arranged on an upper surface of the glass substrate;

a signal wiring layer electrically connected to the plurality of LEDs;

a driving signal wiring layer provided on a lower surface of the glass substrate;

a side wiring provided on a first side surface of the glass substrate and a second side surface of the glass substrate, the second side surface facing opposite to the first side surface, and the side wiring being configured to electrically connect the signal wiring layer to the driving signal wiring layer; and a conductive pattern provided on a third side surface of the glass substrate and a fourth side surface of the glass substrate that are different from the first side surface and the second side surface, the third side surface facing opposite to the fourth side surface, the conductive pattern being further provided on side surfaces of the signal wiring layer and the driving signal wiring layer, and the conductive pattern being connected to a ground via an electronic path that is separate from an electronic path on the signal wiring layer and the driving signal wiring layer, wherein a plurality of reference electrodes configured to ground the plurality of LEDs are included in at least one of the signal wiring layer and the driving signal wiring layer, wherein an electrostatic discharge (ESD) current flows to at least one of the plurality of reference electrodes or the ground through the conductive pattern, in response to an ESD, and wherein the conductive pattern is connected to the plurality of reference electrodes through the at least one via hole.

11. The LED module of claim 10, wherein the conductive pattern is electrically connected to the plurality of reference electrodes.

12. The LED module of claim 10, wherein the glass substrate has a rectangular shape, and the pair of surfaces include flat surfaces.

13. The LED module of claim 10, the conductive pattern has a capacitance larger than a capacitance of the side wiring and an impedance lower than an impedance of the side wiring.

* * * * *